(12) United States Patent
Xu et al.

(10) Patent No.: US 7,376,881 B2
(45) Date of Patent: May 20, 2008

(54) ENCODER SYSTEM, A DECODER SYSTEM, A CODING/DECODING APPARATUS, AN ENCODING METHOD AND A DECODING METHOD

(75) Inventors: Chang Qing Xu, Singapore (SG); Masayuki Tomisawa, Singapore (SG)

(73) Assignee: Oki Techno Centre (Singapore) Pte Ltd, Singapore (SG)

( * ) Notice: Subject to any disclaimer, the term of this patent is extended or adjusted under 35 U.S.C. 154(b) by 507 days.

(21) Appl. No.: 11/132,862

(22) Filed: May 19, 2005

(65) Prior Publication Data

US 2005/0278605 A1  Dec. 15, 2005

(30) Foreign Application Priority Data

Jun. 9, 2004  (SG)  ............... 200403485-6

(51) Int. Cl.
*H04L 1/18* (2006.01)
*H03M 13/03* (2006.01)

(52) U.S. Cl. ..................... 714/751; 714/786

(58) Field of Classification Search ........... 714/746, 714/751, 752, 786, 795
See application file for complete search history.

(56) References Cited

U.S. PATENT DOCUMENTS

| | | | | |
|---|---|---|---|---|
| 4,486,882 A * | 12/1984 | Piret et al. | .................... | 714/788 |
| 5,040,179 A * | 8/1991 | Chen | ........................... | 714/759 |
| 5,327,441 A | 7/1994 | Kawazoe et al. | ........... | 714/795 |
| 6,178,209 B1 | 1/2001 | Hulyalkar et al. | .......... | 375/341 |
| 6,724,741 B1 | 4/2004 | Nieczyporowicz et al. | . | 370/335 |
| 6,928,602 B2 * | 8/2005 | Yamagishi et al. | ......... | 714/781 |
| 7,113,556 B1 * | 9/2006 | Heegard et al. | ............ | 375/346 |

OTHER PUBLICATIONS

Austrian Search Report dated Oct. 6, 2006.
Summerfield, S.: Analysis of convolutional encoders and sythesis of rate-2/n Viterbi decoders, IEEE Transactions Information Theory: vol. 42, Issue 4: Jul. 1996, pp. 1280-1285.
Wireless LAN Medium Access Control (MAC) and physical layer (PHY) specifications, IEEE Standard 802:Nov. 1999.
3 GPP Technical Specification 25.212 V5.2.0: "Multiplexing and channel coding (FDD)", Sep. 2002.

(Continued)

*Primary Examiner*—Shelly A Chase
(74) *Attorney, Agent, or Firm*—Ostrolenk, Faber, Gerb & Soffen, LLP (57) ABSTRACT

An encoder system for encoding a signal according to any number of FEC and/or channel codes comprises a shift register, an array of MOD/XOR stages, and a generator matrix stage for controlling the connections between the shift register and the MOD/XOR stages and altering these connections according to a coding format selected by an encoder selection stage. There is also disclosed a decoder system for decoding a signal encoded according to a number of FEC and/or channel codes comprising a decoding stage, and a generator matrix stage for configuring the decoding stage to a decoding code format to be applied an incoming encoded signal. A decoder selection stage is coupled to the generator matrix stage and selects the decoding code format to be used in the decoding process. The decoder selection stage instructs the generator matrix stage to configure the decoding stage according to the selected decoding code format. There is also disclosed a method for encoding and decoding.

20 Claims, 5 Drawing Sheets

OTHER PUBLICATIONS

L.R. Bahl, J. Cocke, F. Jeinek and J. Raviv, "Optimal decoding of linear codes for minimizing symbol error rate," IEEE Trans. Inform. Theory, vol. 20, pp. 284-287, Mar. 1974.

P. Robertson, E. Villebrun, and P. Hoeher, "A comparison of optimal and sub-optimal decoding algorithms in the log domain," in Proc. ICC, Seattle, WA, pp. 1009-1013, Jun. 1995.

C. Berrou and A. Glavieux, "Near Optimum Error Correcting Coding and Decoding: Turbo Codes," IEEE Trans. Commun., vol. 44, pp. 1261-1271, Oct. 1996.

L. Lin and R.S. Cheng, "Improvements in SOVA-based decoding for Turbo codes," in Proc. ICC, Montreal, Canada, pp. 1473-1478, Jun. 1997.

* cited by examiner

Encoding Side

Decoding Side

ENCODER SYSTEM, A DECODER SYSTEM, A CODING/DECODING APPARATUS, AN ENCODING METHOD AND A DECODING METHOD

FIELD OF THE INVENTION

The present invention relates to an encoder system, a decoder system and a coding/decoding apparatus for a number of FEC and/or channel codes for wireless communications systems, and also to methods for encoding and/or decoding a signal according to any of a number of FEC and/or channel codes.

BACKGROUND OF THE INVENTION

In wireless communications systems, obtaining reliable high-speed communications poses a number of problems for the wireless channel. The signal transmitted over the wireless channel is subject to multi-path distortion which may significantly affect the amplitude and phase of the transmitted signal. Forward error control (FEC)/channel codes are widely used to reduce transmission errors in a radio channel subject to fading. There are many types of conventional FEC/channel codes having error correction capabilities, for example, convolutional codes, block codes, Hamming codes and turbo codes.

The choice of FEC/channel codes will depend on the required quality of service determined by, for example, the data rate, delay rates and error rates, and the radio channel. Typically, different FEC/channel codes will be employed in different standards as different standards will have different target applications and therefore different quality of service (QOS) requirements. However, it may be desired to support, within the same standard, a set of FEC/channel codes providing different coding gains for different services.

To support multiple FEC/channel codes, one commonly used conventional method is to employ multiple encoders in the transmitter and multiple decoders in the receiver. However, this has the disadvantage of requiring the communication equipment to be extremely complex.

Thus, there is a need to provide a coding/decoding (CO-DEC) system and process for use with multiple FEC/channel codes which is less complex and more economical than conventional systems and methods.

SUMMARY OF THE INVENTION

According to a first aspect of the invention, there is provided an encoder system for encoding a signal according to any of a number of FEC and/or channel codes, the system comprising:
  a shift register;
  an array of modulation/ExclusiveOR (MOD/XOR) stages coupled to the shift register;
  a generator matrix stage coupled to at least one of the shift register and the array of MOD/XOR stages to control one or more connections between the shift register and the MOD/XOR stages; and
  an encoder selection stage arranged to select a coding format to be used to encode an incoming signal, the generator matrix stage being arranged to alter the one or more connections between the shift register and the MOD/XOR stages according to the coding format selected by the encoder selection stage.

Preferably, the generator matrix stage is arranged to alter the one or more connections between the shift register and the MOD/XOR stages according to at least one of a WLAN coding format, a WCDMA coding format, a WLAN OFDM coding format, and a WLAN PBCC coding format. In a further preferred embodiment, the generator matrix stage may be arranged to alter the one or more connections between the shift register and the MOD/XOR stages according to a turbo coding format.

The generator matrix stage may be arranged to alter the one or more connections between the shift register and the MOD/XOR stages according to at least one of: a WLAN coding format, a WCDMA coding format, a WLAN OFDM coding format, a WLAN PBCC coding format, and a turbo coding format.

According to a second aspect of the invention there is provided a decoder system for decoding a signal encoded according to any of a number of FEC and/or channel codes, the system comprising:
  a decoding stage;
  a generator matrix stage coupled to the decoding stage to configure the decoding stage to a decoding code format to be applied to decode an incoming signal; and
  a decoder selection stage coupled to the generator matrix stage and arranged to select a decoding code format to be used to decode an incoming encoded signal, wherein the decoder selection stage is arranged to instruct the generator matrix stage to configure the decoding stage according to the decoding code format selected by the decoder selection stage.

Preferably, the decoding stage comprises a reconfigurable Viterbi decoder.

In a preferred embodiment, the reconfigurable Viterbi decoder may comprise:
  the generator matrix stage;
  a branch generation stage for generating one or more branches according to the generator matrix stage, the branch generation stage having an output;
  a branch metric calculation stage controllable by the generator matrix stage, the branch metric calculation stage having an input connected to the output of the branch generation stage, and an output;
  an add-compare-select stage having an input connected to the output of the branch metric calculation stage, and an output; and
  a survivor memory stage having an input connected to the output of the add-compare-select stage, wherein the branch metric calculation stage is arranged to calculate one or more branch metrics which are applied to the input of the add-compare-select stage, and wherein the add-compare-select stage is arranged to locate one or more survivor paths from a number of transitions between states in a trellis defined by the branch generation stage, the survivor memory stage being arranged to store the one or more survivor paths, the decoder being arranged to apply a trace back mechanism to the survivor memory stage during decoding to produces a decoded signal.

Preferably, the decoder selection stage is arranged to instruct the generator matrix stage to configure the decoding stage according to any one or more decoding code formats associated with convolutional codes of WLAN and/or WCDMA communication systems as selected by the decoder selection stage.

In a preferred embodiment, the decoding stage comprises one or more reconfigurable Max-Log-MAP decoders.

The decoding stage may further comprise one or more interleaver stages couplable to one or more of the one or more reconfigurable Max-Log-MAP decoders.

The decoding stage may further comprise a de-interleaver stage couplable to one or more of the one or more reconfigurable Max-Log-MAP decoders.

An interleaver stage may be coupled between a first reconfigurable Max-Log-MAP decoder and a second reconfigurable Max-Log-MAP decoder.

A de-interleaver stage may be coupled between a first reconfigurable Max-Log-MAP decoder and a second reconfigurable Max-Log-MAP decoder.

Preferably, the one or more reconfigurable Max-Log-MAP decoders comprise:

the generator matrix stage having a output;
a trellis generator stage having an input connectable to the output of the generator matrix stage, and an input;
a path metrics calculator stage having an input connectable to the output of the trellis generator stage, the path metrics calculator stage having an output; and
an extrinsic information calculation stage having an input connectable to the output of the path metrics calculator stage, wherein the generator matrix stage is arranged to configure the trellis generator stage and the path metrics calculator stage according to the selected code as defined by the decoder selection stage.

In a preferred embodiment, the decoding stage comprises a reconfigurable decoder arranged to perform decoding tasks for different convolutional and/or RSC codes depending on the decoding code format selected by the decoder selection stage.

In a further preferred embodiment, the decoding stage comprises a reconfigurable decoder arranged to perform decoding tasks for one or more turbo codes depending on the decoding code format selected by the decoder selection stage.

According to a third aspect of the invention there is provided a coding and decoding system (codec) for encoding and decoding a signal according to any of a number of FEC and/or channel codes comprising the encoder system defined above.

According to a fourth aspect of the invention there is provided a coding and decoding system (codec) for encoding and decoding a signal according to any of a number of FEC and/or channel codes comprising the decoder system defined above.

According to a fifth aspect of the invention there is provided a coding and decoding system (codec) for encoding and decoding a signal according to any of a number of FEC and/or channel codes comprising the encoder system defined above and the decoder system defined above.

According to a sixth aspect of the invention there is provided a method for encoding a signal according to any of a number of FEC and/or channel codes, the method comprising the steps of:

selecting in an encoder selection stage a coding format to be used to encode an incoming signal;
altering in a generator matrix stage one or more connections between a shift register and one or more MOD/XOR stages according to the selected coding format selected by the encoder selection stage.

According to a seventh aspect of the invention there is provided a method for decoding a signal according to any of a number of FEC and/or channel codes, the method comprising the steps of:

selecting in a decoder selection stage a decoding code format to be used to decode an incoming encoded signal;
applying the selected decoding code format to a generator matrix stage; and
configuring using the generator matrix stage a decoder stage to decode an incoming signal according to the selected decoding code format.

BRIEF DESCRIPTION OF THE DRAWINGS

The present invention will now be described by way of example and with reference to the accompanying drawings in which.

DESCRIPTION OF PREFERRED EMBODIMENTS

The standards for WLAN/WCDMA systems include several types of convolutional codes.

Figure 1A:
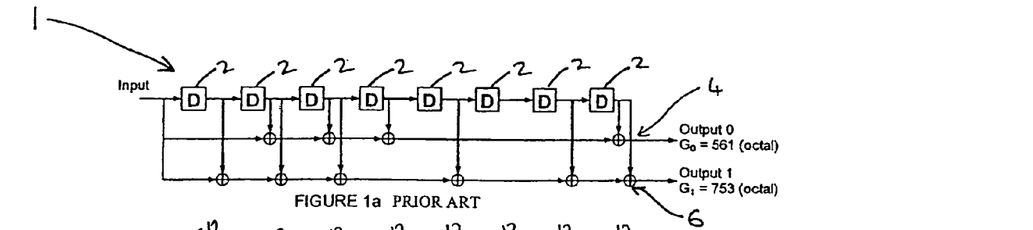
FIG. 1a is a schematic block diagram of a conventional rate 1/2 convolutional encoder for use in WCDMA systems.

FIG. 1a illustrates a conventional rate 1/2 convolutional encoder 1 for use in typical WCDMA systems. The encoder 1 comprises a number of bistable stages 2 connected in sequence to form a shift register. In the system of FIG. 1a, the encoder 1 comprises eight bistable stages 2. The outputs of the bistable stages 2 of the shift register are coupled to a plurality of Modulo/ExclusiveOR (MOD/XOR) stages 4, 6 which are arranged to form two rows of sequentially connected MOD/XOR stages.

As the encoder 1 has a rate of 1/2, it receives one input signal and produces two output signals. The input signal passes through the bistable stages 2 forming the shift register and is applied to the two rows of MOD/XOR stages 4, 6. The outputs from the bistable stages 2 of the shift register are connected to the MOD/XOR stages 4, 6 in a predetermined sequence to produce the two output signals Output 0 and Output 1. The output signals are thereby encoded.

The output signal Output 0 from the outputs of the first row 4 of MOD/XOR stages according to the configuration of FIG. 1a is encoded according to a coding $G_0$ which equals 561 in octals. The output signal Output 1 from the outputs of the second row 6 of MOD/XOR stages according to the configuration of FIG. 1a is encoded according to a coding $G_1$ which equals 753 in octals.

Figure 1B:
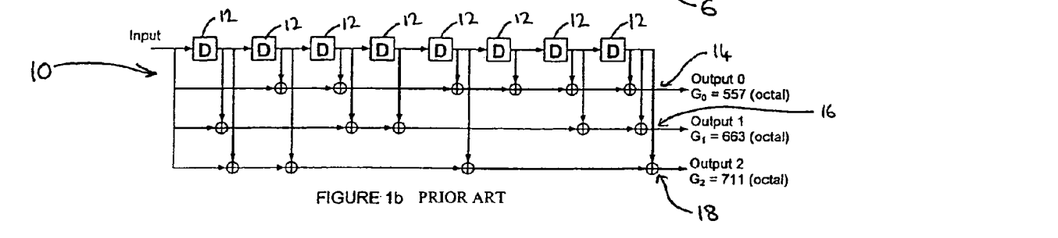
FIG. 1b is a schematic block diagram of a conventional rate 1/3 convolutional encoder for use in WCDMA systems.

FIG. 1b shows an alternative conventional convolutional encoder 10 for use in typical WCDMA systems. The encoder 10 has a rate of 1/3 and thus receives one input signal and produces three output signals. The encoder 10 comprises a number of bistable stages 12 connected in sequence to form a shift register. In the system of FIG. 1b the encoder 10 comprises eight bistable stages 12. The encoder 8 also comprises a plurality of MOD/XOR stages 14, 16, 18 which are arranged to form three rows of sequentially connected MOD/XOR stages.

The input signal passes through the bistable stages 12 of the shift register the outputs of which are coupled to the rows of MOD/XOR stages 14, 16, 18 in a predetermined sequence to produce the three output signals Output 0, Output 1 and Output 2. The output signals are thereby encoded.

The output signal Output 0 from the outputs of the first row 14 of MOD/XOR stages according to the configuration of FIG. 1b is encoded according to the a coding $G_0$ which equals 557 in octals. The output signal Output 1 from the outputs of the second row 16 of MOD/XOR stages according to the configuration of FIG. 1b is encoded according to the a coding $G_1$ which equals 663 in octals. The output signal Output 2 from the outputs of the third row 18 of MOD/XOR stages according to the configuration of FIG. 1b is encoded according to the a coding $G_2$ which equals 711 in octals.

Figure 2A:
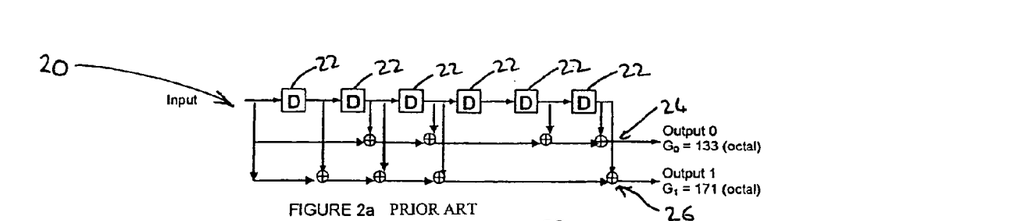
FIG. 2a is a schematic block diagram of a conventional rate 1/2 convolutional encoder for use in WLAN OFDM mode.

FIG. 2a shows a conventional rate 1/2 convolutional encoder for use in WLAN OFDM mode. This encoder 20 comprises a series of bistable stages 22 connected sequentially to form a shift register. The system of FIG. 2a comprises six bistable stages 22 connected in sequence. A plurality of MOD/XOR stages are arranged in two rows 24, 26, the MOD/XOR stages being connected sequentially in each row 24, 26.

The encoder 20 of FIG. 2a has one input and two outputs. The input signal passes through the bistable stages 22 forming the shift register and the outputs from the bistable stages 22 of the shift register are connected to the MOD/XOR stages in a predetermined sequence to produce the two output signals Output 0 and Output 1. The output signals are thereby encoded.

The output signal Output 0 from the outputs of the first row 24 of MOD/XOR stages according to the configuration of FIG. 2a is encoded according to a coding $G_0$ which equals 133 in octals. The output signal Output 1 from the outputs of the second row 26 of MOD/XOR stages according to the configuration of FIG. 2a is encoded according to a coding $G_1$ which equals 171 in octals.

Figure 2B:
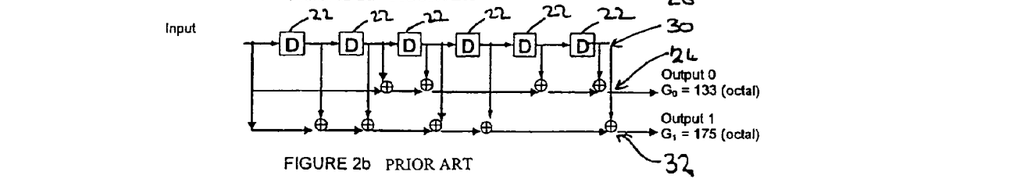
FIG. 2b is a schematic block diagram of a conventional rate 1/2 convolutional encoder for use in WLAN PBCC mode.

FIG. 2b is a schematic block diagram of a conventional rate 1/2 convolutional encoder 30 for WLAN PBCC mode. The structure of the encoder 30 of FIG. 2b is the same as that described above in connection with FIG. 2a and the same reference numerals are used for corresponding components in the two systems. The only structural difference between the systems of FIGS. 2a and 2b is in the arrangement of the second row of MOD/XOR stages 26, 32 to provide the appropriate coding for the respective systems.

The output signal Output 0 from the outputs of the first row 24 of MOD/XOR stages according to the configuration of FIG. 2b is encoded according to a coding $G_0$ which equals 133 in octals. The output signal Output 1 from the outputs of the second row 32 of MOD/XOR stages according to the configuration of FIG. 2b is encoded according to a coding $G_1$ which equals 175 in octals.

Figure 3:
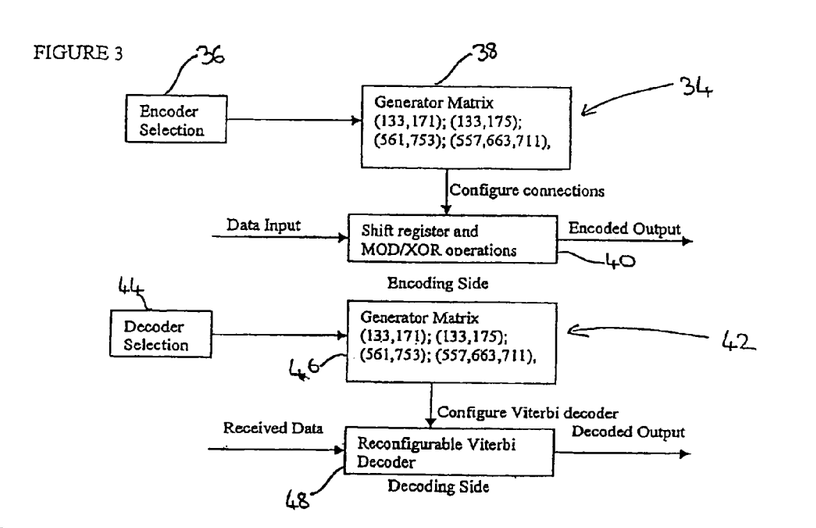
FIG. 3 is a schematic block diagram of a CODEC for use in WLAN and WCDMA systems according to a preferred embodiment of the invention.

FIG. 3 is a schematic block diagram of a general CODEC according to a preferred embodiment of the invention for use in, for example, WLAN and WCDMA two-mode communication systems.

The encoder section 34 comprises an encoder selection section 36 which selects the particular code to be used for the encoding process. The encoder selection section 36 is coupled to the input of a generator matrix stage 38. The output of the generator matrix stage 38 is connected to the input of a shift register and an array of MOD/XOR gates 40. The input signal is applied to the shift register and the array of MOD/XOR gates 40 where it is encoded. The generator matrix stage 38 configures the connections between the shift register and the MOD/XOR gates, depending on the selection made by the encoder selection section 36 to produce the encoded output signals. For example, the generator matrix stage 38 may configure the aforementioned connections according to the codings $G_0$, $G_1$ and $G_2$ given above in respect of FIGS. 1a to 2b.

The decoder section 42 of the system of FIG. 3 comprises a decoder selection stage 44 the output of which is coupled to a generator matrix stage 46. The output of the generator matrix stage 46 is coupled to a reconfigurable Viterbi decoder 48. The reconfigurable Viterbi decoder 48 is configured in accordance with the decoder selection stage 42 to decode the incoming data applied to the input of the reconfigurable Viterbi decoder 48 to recover the original data.

The reconfigurable Viterbi decoder 48 may perform decoding tasks for different convolutional codes with the generator matrix stage 46 supplying the configuration settings in the form of input parameters.

Figure 4:
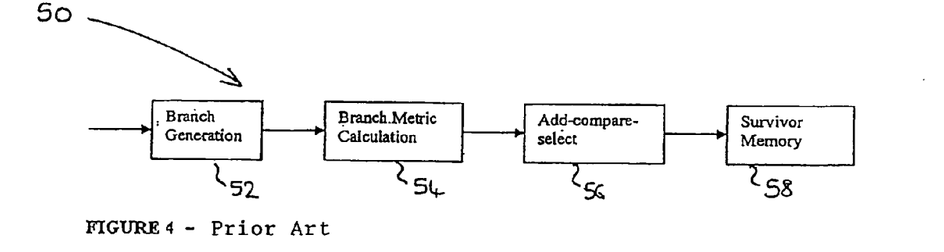
FIG. 4 is a schematic block diagram of a conventional Viterbi decoder.

A conventional Viterbi decoder 50 is shown in FIG. 4. The Viterbi decoder 50 is a form of maximum likelihood decoder for the decoding of convolutional codes.

In the conventional Viterbi decoder 50 shown in FIG. 4, the incoming signal is applied to a branch generation stage 52 which generates branches of a trellis according to fixed generator matrix settings. The output of the branch generation stage 52 is applied to the input of a branch metric calculation stage 54. The branch metric calculation stage 54 measures the difference between the received symbol and the symbol that causes the transitions between the states in the trellis. The branch metric for all possible transitions between all pairs of states in a given trellis (as defined by the generator matrix) are generated in the branch metric calculation stage 54.

The output of the branch metric calculation stage 54 is applied to the input of an add-compare-select (ACS) stage 56 which determines the survivor path entering each state of the trellis. The branch metrics of a given transition between states in a given trellis are added in the ACS stage 56 to the corresponding partial path metrics stored in a path metric memory (not shown). The new partial path metrics for the survivor paths are then compared in the ACS stage 56 with all of the other new partial path metrics corresponding to all the other transitions entering that state. The transition which has the minimum partial path metric is selected to be the survivor path of the state.

The path metric of the survivor path of each state is then updated and stored in the path metric memory within the ACS stage 56.

The ACS stage 56 is the core of a conventional Viterbi decoder which typically consists of many ACS blocks 56.

The output from the ACS stage 56 is coupled to a survivor memory stage 58 and the survivor memory stage 58 stores the survivor paths. A trace back mechanism is applied to the survivor memory during the decoding stage to recover the original data.

It will be seen from the above that the branch generation and the branch metric calculation stages 52, 54 are closely related to the generator matrix of a convolutional code. It has been appreciated that, and according to a preferred embodiment of the invention, by adding a generator matrix to control the settings of the branch generation stage 52 and the branch metric calculation stage 54, a reconfigurable Viterbi decoder may be constructed. Such a reconfigurable decoder may decode different convolutional codes.

Figure 5:
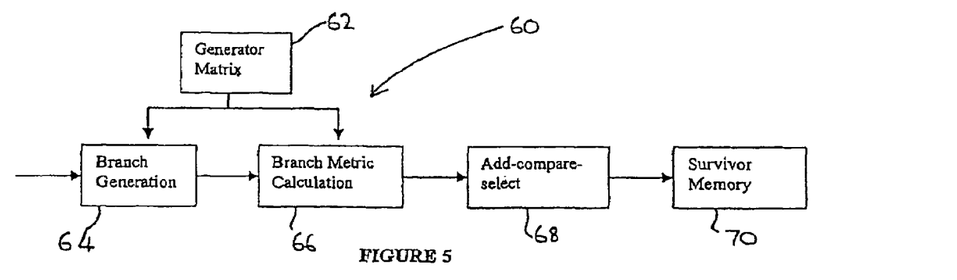
FIG. 5 is a schematic block diagram of a reconfigurable Viterbi decoder according to an embodiment of the invention.

FIG. 5 is a schematic block diagram showing a reconfigurable Viterbi decoder 60 according to a preferred embodiment of the present invention.

In FIG. 5, a generator matrix 62 is configured by a decoder selection stage (not shown) and applied to a branch metric generation stage 64 and a branch metric calculation stage 66 to control the settings of the branch metric generation stage 64 and the branch metric calculation stage 66. The encoded signal received by the decoder 60 is applied to an input of the branch generation stage 64, the output of which is coupled to the branch metric calculation stage 66. The branch metrics calculated in the branch metric calculation stage 66 are applied to the input of an ACS stage 68. The survivor paths from the ACS stage 68 are applied to and stored in a survivor memory 70. The trace back mechanism applied to the survivor memory 70 during the decoding stage produces the decoded sequence.

A general CODEC embodying the reconfigurable Viterbi decoder 60 according to a preferred embodiment of the invention has a high flexibility and is less complex compared to a conventional CODEC used in multiple FEC/channel codes.

By altering the settings, for example of the generator matrices, it is possible to support a number of different FEC/channel codes whilst keeping the core modules unchanged.

The decoder of FIG. 5 is therefore particularly useful for communications systems with multiple FEC/channel codes, for example, multi-mode wireless communications systems.

According to a further preferred embodiment of the invention, a communications system with two forms of turbo codes is considered.

Figure 6:
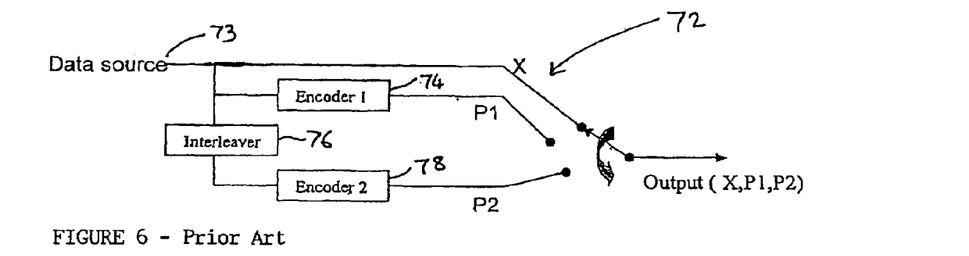
FIG. 6 is a schematic block diagram of a conventional turbo encoder system having two turbo codes.

FIG. 6 illustrates a conventional turbo code generator system 72. In the system 72 of FIG. 6, a data source (X) 73 is coupled to a first encoder 74 to produce an output P1. It is also applied to an interleaver stage 76, the output of which is coupled to a further encoder 78 which has the same structure as the first encoder 74, to produce an output signal P2. The output signal is obtained by cycling between the data source (X) 73, the output P1 from the first encoder 74 and the output P2 from the second encoder 78.

Figure 7:
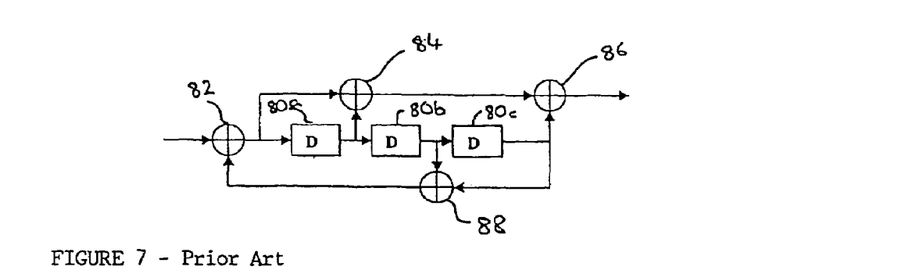
FIG. 7 is a schematic block diagram of the structure of a conventional encoder for use in the system of FIG. 6 applicable to a first turbo code.

FIG. 7 is a schematic representation of the encoders 74, 78 of FIG. 6 used to produce a first turbo code. The system of FIG. 7 comprises a three stage shift register 80 formed of three sequentially connected bistable stages 80a, 80b and 80c, and an array of MOD/XOR stages 82, 84, 86, 88.

The incoming signal to the system of FIG. 7 is applied to a first MOD/XOR stage 82 in the array of MOD/XOR stages. The output of the first MOD/XOR stage 82 is applied to the input of the shift register 80 and also to a further MOD/XOR stage 84 where it is combined with the output of a first bistable stage 80a of the shift register 80. The output of the further MOD/XOR stage 84 is applied to another MOD/XOR stage 86 where it is combined with the output of the shift register 80 to produce an output signal. The output of the shift register 80 is also applied to the input of a still further MOD/XOR stage 88, as is the output from a second bistable stage 80b in the shift register 80. The output of the MOD/XOR stage 88 then is applied to the first MOD/XOR stage 82 which combines this output with the incoming signal.

The encoder of FIG. 7 is a recursive systematic convolutional (RSC) encoder with a generator matrix of $(1+D+D^3)/(1+D^2+D^3)$. Therefore the encoders 74, 78 used in the system of FIG. 6 for the first encoder code may comprise two identical recursive systematic convolutional (RSC) encoders of the type shown in FIG. 7 with a generator matrix of $(1+D+D^3)/(1+D^2+D^3)$.

Figure 8:
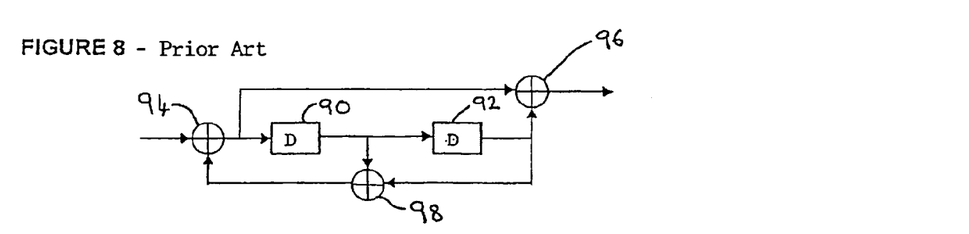
FIG. 8 is a schematic block diagram of the structure of a conventional encoder for use in the system of FIG. 6 applicable to a second turbo code.

FIG. 8 is a schematic representation of the encoders of FIG. 6 used to produce a second turbo code. The system of FIG. 8 comprises a two-stage shift register comprising two bistable stages 90, 92 and an array of three MOD/XOR stages 94, 96 and 98.

The input signal to the system of FIG. 8 is applied to a first stage 94 of the MOD/XOR stages. The output of the first stage 94 of the MOD/XOR stages is applied to input of the first bistable stage 90 of the shift register and it is also applied to the input of a second stage 96 of the MOD/XOR stages to produce the output signal. The output of the first bistable stage 90 of the shift register is applied to the input of the second bistable stage 92 of the shift register and to the input of a third stage 98 of the MOD/XOR stages. The output of the second bistable stage 92 of the shift register is applied to the inputs of the second and third stages 96, 98 of the MOD/XOR stages. The output of the third MOD/XOR stage 98 is then applied to the input of the first MOD/XOR stage 94 where it is combined with the incoming signal.

Therefore the encoders 74, 78 used in the system of FIG. 6 for the second encoder code may comprise two identical recursive systematic convolutional (RSC) encoders of the type shown in FIG. 8 with a generator matrix of $(1+D^2)/(1+D+D^2)$.

Figure 9:
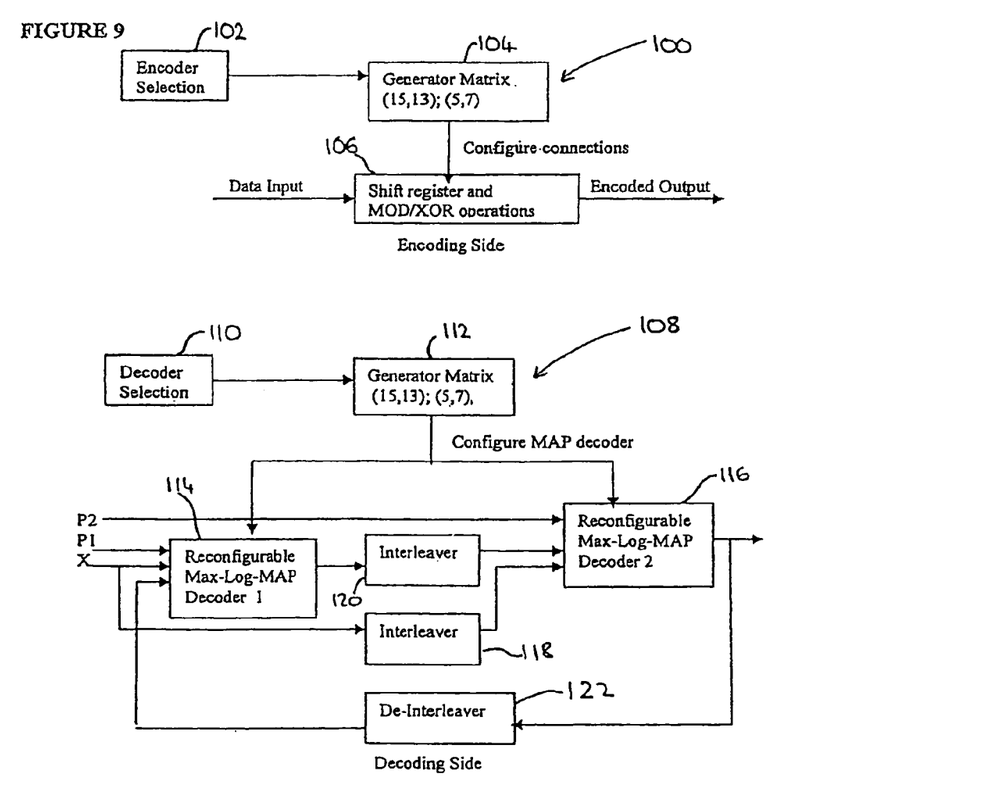
FIG. 9 is a schematic block diagram of a CODEC for two turbo codes according to an embodiment of the invention.

FIG. 9 shows a system according to a preferred embodiment of the invention for a general CODEC capable of operating in multiple turbo codes. In the encoding section 100, an encoder selection stage 102 determines on which code it is going to operate. The output of the encoder selection stage 102 is coupled to the input of a generator matrix stage 104, the output of which is coupled to the input of a shift register and MOD/XOR array 106.

The generator matrix stage 104 configures the connections between the shift register and the MOD/XOR stages according to the code selected in the encoder selection stage 102.

The data input is applied to the shift register and the MOD/XOR stage 106 where it is encoded to produce the encoded output signal.

In the decoding section 108, the output of a decoder selection stage 110 is coupled to the input of a generator matrix stage 112. The decoder selection stage 110 determines the decoding method to be applied to the encoded incoming signal. The output of the generator matrix stage 112 is coupled to the inputs of two reconfigurable max-log-MAP (maximum a posteriori) decoders 114, 116. The generator matrix stage 112 sets the configuration of the reconfigurable max-log-MAP decoders 114, 116 according to the instructions received from the decoder selection stage 110.

The first input signal X is applied directly to the input of the first decoder 114 and also to the input of 116 second decoder through a first interleaver stage 118. The output of the first decoder 114 is passed to the input of the second decoder 116 through a second interleaver 120.

The second input P1 signal is also applied to an input of the first decoder 114.

The output of a deinterleaver stage 122 which has as its input the output of the second decoder 116, is applied as a further input signal to the first decoder 114.

A further input signal P2 is applied directly to an input of the second decoder 116. Thus, the second decoder 116 receives, as inputs, the further input signal P2, the output of the first decoder 114 via the second interleaver 120, and the output of the first interleaver 118. The decoded signal is obtained from the output of the second decoder 116.

Thus, it has been appreciated that the four RSC encoders necessary in conventional systems having a separate coding system for each code, may be replaced by a single shift register, as shown in the encoding section 100 of FIG. 9. It has also been appreciated that the connections between the shift register and MOD/XOR operation may be configured by a generator matrix, according to the code to be applied, to support different encoders, as is shown in FIG. 9.

Furthermore, a dynamically configured max-log-MAP (maximum a posteriori) decoder is employed in the system of FIG. 9. This max-log-MAP decoder may perform decoding tasks, for example, for different recursive systematic convolutional (RSC) codes, with the generator matrix determining the decoding method to be applied according to the instructions from the decoder selection stage 110.

A reconfigurable max-log-MAP decoder which may be used in the system of FIG. 9, is a modified Viterbi decoder. The structure of a max-log-MAP decoder according to a preferred embodiment of the invention is illustrated in FIG. 10.

Figure 10:
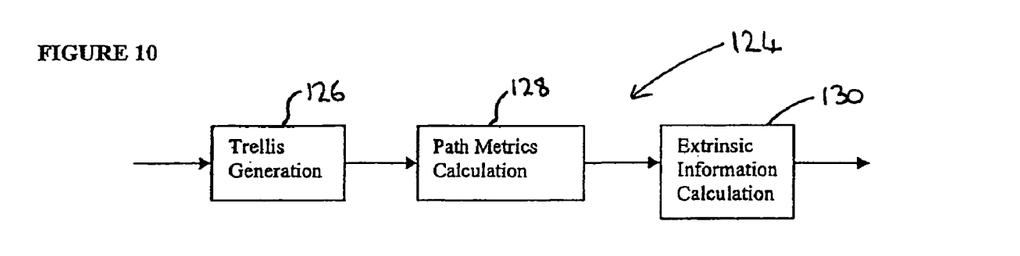
FIG. 10 is a schematic block diagram of a conventional max-log-MAP decoder structure.

The decoder 124 of FIG. 10 comprises three function stages. The input signal is applied to a first stage 126 which is a trellis generation stage. This stage 126 generates the trellis structure information for the turbo code to be decoded. The trellis structure depends on the generator matrix of the RSC code for the turbo code to be decoded.

The output of the trellis generation stage 126 is applied to a second stage 128 which is a path metrics calculation stage. The path metrics calculated in the path metrics calculation stage 128 include alpha and beta functions, where alpha represents probability distributions accumulated in the forward direction along the trellis structure and beta represents probability distributions accumulated in the backward direction along the trellis structure. The alpha and beta path metrics are obtained through the forward and backward recursions respectively.

The output of the path metrics calculation stage 128 is applied to the input of an extrinsic information calculation stage 130. Extrinsic information lambda may be used as a priori input information by a further decoder (not shown). Lambda is determined by the alpha and beta path metrics.

The trellis generation stage 126 and the path metrics calculation stage 128 are closely related to the trellis structure defined by the generator matrix of an RSC code. By adding a generator matrix to control the settings of the trellis generation stage 126 and the path metrics calculation stage 128, a reconfigurable max-log-MAP decoder, may be constructed. Such a reconfigurable decoder will decode different RSC convolutional codes. Thus, such a decoder may therefore be used to decode different turbo codes.

Figure 11:
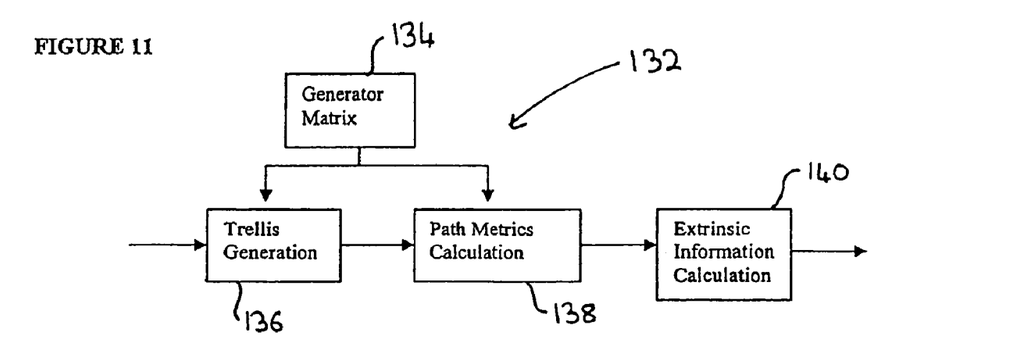
FIG. 11 is a schematic block diagram of a reconfigurable max-log-MAP decoder according to an embodiment of the invention.

FIG. 11 shows a reconfigurable max-log-MAP decoder 132 according to a preferred embodiment of the invention for use, for example, in the system of FIG. 9.

The decoder 132 of FIG. 11 comprises a generator matrix stage134, the output of which is coupled to the input of a trellis generation stage 136 and the input of a path metrics calculation stage 138. The generator matrix stage 134 is instructed by the decoding selection stage (not shown) to determine the decoding method to be applied.

The input signal is applied to the trellis generation stage 136 to generate the trellis structure information for the turbo code to be decoded. The output of the trellis generation stage 136 is passed to the input of the path metrics calculation stage 138. Alpha and beta functions are calculated in the path metrics calculation stage 138, where alpha represents probability distributions accumulated in the forward direction along the trellis structure and beta represents probability distributions accumulated in the backward direction along the trellis structure. The alpha and beta path metrics are obtained through the forward and backward recursions respectively.

The output of the path metrics calculation stage 138 is applied to the input of an extrinsic information calculation stage 140 and extrinsic information lambda may be used as a priori input information by a further decoder (not shown). Lambda is determined by the alpha and beta path metrics.

Thus, the decoder 132 of FIG. 11, when used in a system such as that of FIG. 9, may support the decoding of different turbo codes by sharing common core modules, thereby reducing the complexity and cost of the system.

In a further preferred embodiment (not shown), the first two embodiments described above in connection with FIGS. 3 and 9 may be combined. In a general codec according to this further embodiment for use in a wireless communication system, several types of convolutional codes and turbo codes may be used for encoding and decoding.

In the encoder section, all convolutional and/or RSC encoders may share the same shift register, and the connections between the shift register and MOD/XOR operation stages may be configured to support the different encoding systems.

In the decoding section, a reconfigurable Viterbi decoder of the type shown in FIG. 11 may be used to perform decoding tasks for different convolutional and RSC codes, with the generator matrix controlling the configuration of the decoder.

Embodiments of the present invention have widespread applicability as multiple FEC/channel codes are quite common in wireless communications systems. Embodiments of the present invention aim to permit a reduction in the implementation cost and to enhance the flexibility of wireless communication terminals, base stations and access points.

The invention claimed is:

1. An encoder system for encoding a signal according to any of a number of FEC and/or channel codes, the system comprising:
   a shift register;
   an array of MOD/XOR stages coupled to the shift register;
   a generator matrix stage coupled to at least one of the shift register and the array of MOD/XOR stages to control one or more connections between the shift register and the MOD/XOR stages; and an encoder selection stage arranged to select a coding format to be used to encode an incoming signal, the generator matrix stage being arranged to alter the one or more connections between the shift register and the MOD/XOR stages according to the coding format selected by the encoder selection stage.

2. An encoder system according to claim 1, wherein the generator matrix stage is arranged to alter the one or more connections between the shift register and the MOD/XOR stages according to at least one of:
  a WLAN coding format,
  a WCDMA coding format,
  a WLAN OFDM coding format,
  a WLAN PBCC coding format, and
  a turbo coding format.

3. An encoder system according to claim 1, wherein the generator matrix stage is arranged to alter the one or more connections between the shift register and the MOD/XOR stages according to a turbo coding format.

4. A coding and decoding system (codec) for encoding and decoding a signal according to any of a number of FEC and/or channel codes comprising the encoder system of claim 1.

5. A decoder system for decoding a signal encoded according to any of a number of FEC and/or channel codes, the system comprising:
  a decoding stage;
  a generator matrix stage coupled to the decoding stage to configure the decoding stage to a decoding code format to be applied to decode an incoming signal; and
  a decoder selection stage coupled to the generator matrix stage and arranged to select a decoding code format to be used to decode an incoming encoded signal,
wherein the decoder selection stage is arranged to instruct the generator matrix stage to configure the decoding stage according to the decoding code format selected by the decoder selection stage.

6. A decoder system according to claim 5, wherein the decoding stage comprises a reconfigurable Viterbi decoder.

7. A decoder system according to claim 6, wherein the reconfigurable Viterbi decoder comprises:
  the generator matrix stage;
  a branch generation stage for generating one or more branches according to the generator matrix stage, the branch generation stage having an output;
  a branch metric calculation stage controllable by the generator matrix stage, the branch metric calculation stage having an input connected to the output of the branch generation stage, and an output;
  an add-compare-select stage having an input connected to the output of the branch metric calculation stage, and an output; and
  a survivor memory stage having an input connected to the output of the add-compare-select stage,
wherein the branch metric calculation stage is arranged to calculate one or more branch metrics which are applied to the input of the add-compare-select stage, and
wherein the add-compare-select stage is arranged to locate one or more survivor paths from a number of transitions between states in a trellis defined by the branch generation stage, the survivor memory stage being arranged to store the one or more survivor paths,
the decoder being arranged to apply a trace back mechanism to the survivor memory stage during decoding to produces a decoded signal.

8. A decoder system according to claim 5, wherein the decoder selection stage is arranged to instruct the generator matrix stage to configure the decoding stage according to any one or more decoding code formats associated with convolutional codes of WLAN and/or WCDMA communication systems as selected by the decoder selection stage.

9. A decoder system according to claim 5, wherein the decoding stage comprises one or more reconfigurable Max-Log-MAP decoders.

10. A decoder system according to claim 9, wherein decoding stage further comprises one or more interleaver stages couplable to one or more of the one or more reconfigurable Max-Log-MAP decoders.

11. A decoder system according to claim 10, wherein an interleaver stage is coupled between a first reconfigurable Max-Log-MAP decoder and a second reconfigurable Max-Log-MAP decoder.

12. A decoder system according to claim 9, wherein the decoding stage further comprises a de-interleaver stage couplable to one or more of the one or more reconfigurable Max-Log-MAP decoders.

13. A decoder system according to claim 12, wherein a de-interleaver stage is coupled between a first reconfigurable Max-Log-MAP decoder and a second reconfigurable Max-Log-MAP decoder.

14. A decoder system according to claim 9, wherein the one or more reconfigurable Max-Log-MAP decoders comprise:
  the generator matrix stage having a output;
  a trellis generator stage having an input connectable to the output of the generator matrix stage, and an input;
  a path metrics calculator stage having an input connectable to the output of the trellis generator stage, the path metrics calculator stage having an output; and
  an extrinsic information calculation stage having an input connectable to the output of the path metrics calculator stage,
wherein the generator matrix stage is arranged to configure the trellis generator stage and the path metrics calculator stage according to the selected code as defined by the decoder selection stage.

15. A decoder system according to claim 5, wherein the decoding stage comprises a reconfigurable decoder arranged to perform decoding tasks for different convolutional and/or RSC codes depending on the decoding code format selected by the decoder selection stage.

16. A decoder system according to claim 5, wherein the decoding stage comprises a reconfigurable decoder arranged to perform decoding tasks for one or more turbo codes depending on the decoding code format selected by the decoder selection stage.

17. A coding and decoding system (codec) for encoding and decoding a signal according to any of a number of FEC and/or channel codes comprising the decoder system of claim 5.

18. A coding and decoding system (codec) for encoding and decoding a signal according to any of a number of FEC and/or channel codes comprising an encoder system, and a decoder system, wherein the encoder system comprises:
  a shift register;
  an array of MOD/XOR stages coupled to the shift register;
  a generator matrix stage coupled to the shift register and/or the array of MOD/XOR stages to control one or more connections between the shift register and the MOD/XOR stages;

an encoder selection stage arranged to select a coding format to be used to encode an incoming signal;

the generator matrix stage being arranged to alter the one or more connections between the shift register and the MOD/XOR stages according to the coding format selected by the encoder selection stage; and wherein the decoder system comprises:

a decoding stage;

a generator matrix stage coupled to the decoding stage to configure the decoding stage to a decoding code format to be applied to decode an incoming signal;

a decoder selection stage coupled to the generator matrix stage and arranged to select a decoding code format to be used to decode an incoming encoded signal; wherein the decoder selection stage is arranged to instruct the generator matrix stage to configure the decoding stage according to the decoding code format selected by the decoder selection stage.

19. A method for encoding a signal according to any of a number of FEC and/or channel codes, the method comprising the steps of:

selecting in an encoder selection stage a coding format to be used to encode an incoming signal;

altering in a generator matrix stage one or more connections between a shift register and one or more MOD/XOR stages according to the selected coding format selected by the encoder selection stage.

20. A method for decoding a signal according to any of a number of FEC and/or channel codes, the method comprising the steps of:

selecting in a decoder selection stage a decoding code format to be used to decode an incoming encoded signal;

applying the selected decoding code format to a generator matrix stage; and configuring using the generator matrix stage a decoder stage to decode an incoming signal according to the selected decoding code format.

* * * * *